(12) United States Patent
Islam et al.

(10) Patent No.: US 7,795,710 B2
(45) Date of Patent: Sep. 14, 2010

(54) LEAD FRAME ROUTED CHIP PADS FOR SEMICONDUCTOR PACKAGES

(75) Inventors: Shafidul Islam, Plano, TX (US); Romarico Santos San Antonio, Batam Island (ID); Anang Subagio, Batam Island (ID)

(73) Assignee: Unisem (Mauritius) Holdings Limited, Port Louis (MU)

( * ) Notice: Subject to any disclaimer, the term of this patent is extended or adjusted under 35 U.S.C. 154(b) by 114 days.

(21) Appl. No.: 10/561,381

(22) PCT Filed: Jun. 18, 2004

(86) PCT No.: PCT/US2004/019523

§ 371 (c)(1), (2), (4) Date: Dec. 16, 2005

(87) PCT Pub. No.: WO2005/004200

PCT Pub. Date: Jan. 13, 2005

(65) Prior Publication Data

US 2006/0151860 A1 Jul. 13, 2006

Related U.S. Application Data

(60) Provisional application No. 60/482,527, filed on Jun. 25, 2003.

(51) Int. Cl.
*H01L 23/495* (2006.01)
(52) U.S. Cl. .............. 257/666; 257/667; 257/668; 257/672; 257/673; 257/676; 257/687; 257/690; 257/693; 257/691; 257/692; 257/734; 257/778; 257/E23.001; 257/E23.01; 257/E23.066; 257/E23.116; 257/E23.141; 257/E23.031; 257/E23.039; 257/E23.061; 257/E23.067

(58) Field of Classification Search ............... None
See application file for complete search history.

(56) References Cited

U.S. PATENT DOCUMENTS

| | | | |
|---|---|---|---|
| 5,450,283 A * | 9/1995 | Lin et al. | 361/704 |
| 5,600,741 A * | 2/1997 | Hauer et al. | 385/35 |
| 6,011,300 A | 1/2000 | Muramatsu | |
| 6,130,480 A | 10/2000 | Ohuchi et al. | |
| 6,380,002 B2 * | 4/2002 | Hsu et al. | 438/118 |
| 6,433,412 B2 | 8/2002 | Ando et al. | |
| 6,477,034 B1 | 11/2002 | Chakravorty et al. | |

(Continued)

*Primary Examiner*—Minh-Loan T Tran
*Assistant Examiner*—Fei Fei Yeung Lopez
(74) *Attorney, Agent, or Firm*—Wiggin and Dana LLP

(57) ABSTRACT

A redistributed lead frame for use in molded plastic semiconductor package (38) is formed from an electrically conductive substrate by a sequential metal removal process. The process includes: (a) patterning a first side of an electrically conductive substrate to form an array of lands separated by channels, (b) disposing a first molding compound (18) within these channels, (c) patterning a second side of the electrically conductive substrate to form an array of chip attach sites (24) and routing circuits (26) electrically interconnecting the array of lands and the array of chip attached sites (24), (d) directly electrically interconnecting input/output pads on the at least one semiconductor device (28) to chip attach site members (24) of the array of chip attach sites (24), and (e) encapsulating the at least one semiconductor device (28), the array of chip attach sites (24) and the routing circuits (26) with a second molding compound (36). This process is particularly suited for the manufacture of chip scale packages and very thin packages.

14 Claims, 5 Drawing Sheets

U.S. PATENT DOCUMENTS

| | | |
|---|---|---|
| 6,498,099 B1 | 12/2002 | McLellan et al. |
| 6,620,722 B2 | 9/2003 | Kuo et al. |
| 6,664,615 B1 * | 12/2003 | Bayan et al. ................ 257/666 |
| 6,670,222 B1 * | 12/2003 | Brodsky .................... 438/118 |
| 6,967,401 B2 * | 11/2005 | Sakamoto et al. ........... 257/706 |
| 2002/0105077 A1 * | 8/2002 | Choi ......................... 257/738 |
| 2002/0168796 A1 * | 11/2002 | Shimanuki et al. .......... 438/106 |
| 2003/0203539 A1 | 10/2003 | Islam et al. |

* cited by examiner

LEAD FRAME ROUTED CHIP PADS FOR SEMICONDUCTOR PACKAGES

CROSS REFERENCE TO RELATED PATENT APPLICATION

This patent application relates to, and claims priority to, U.S. Provisional Patent Application Ser. No. 60/482,527, filed Jun. 25, 2003. The subject matter of that provisional patent application is incorporated by reference in its entirety herein.

BACKGROUND OF THE INVENTION

1. Field of the Invention

This invention relates to a lead frame for molded plastic packages of the type that encapsulates one or more semiconductor devices. More particularly, the lead frame is formed by a sequential metal removal process that selectively patterns external lead ends, routing circuits and internal lead ends from a single electrically conductive substrate.

2. Description of the Related Art

One type of package used to encase semiconductor devices is a molded plastic package. The semiconductor device is encased in a block of polymer resin that provides environmental protection. Electrical signals are transmitted between the semiconductor device and external circuitry, such as a printed circuit board ("PCB"), by a number of different electrically conductive structures. In a leaded package, an electrically conductive lead frame has inner lead ends and opposing outer lead ends. The lead frame configuration is typically formed by chemical etching. The pitch of the inner lead ends is limited by etching considerations to about the thickness of the lead frame. As a result, the leads terminate a distance from the semiconductor device and are electrically interconnected to input/output pads on the semiconductor device by small diameter wires. The leads extend outward from the inner lead ends to terminate at outer lead ends that are soldered to contact pads on external circuitry. The footprint (surface area on a printed circuit board or other external structure) occupied by this type of leaded package is significantly greater than the footprint of the semiconductor device.

There is a desire in the semiconductor packaging industry to minimize the footprint of semiconductor packages with a goal to obtain chip-scale packages where the footprint of the package is not greater than the footprint of the semiconductor device. In a leaded package, there is always a sizable difference between the bond-pad pitch at the inner leads and the land-pitch external to the package which is utilized for circuit board attach. The bond-pad pitch trends to achieve finer geometries to maximize the use of silicon real estate, while the circuit board level pitch remains more widely spaced for PCB routing and soldering. The fan-out of the lead frame from chip bond-pad pitch to external land pitch causes the package to occupy a much larger footprint than the semiconductor device. This is contrary to the concept and demand for Chip-Scale-Packaging ("CSP").

The trend towards CSP has driven the evolution of "array" packages with external lands arranged in a grid array at a suitable circuit board-attach pitch. This gird array is constrained within the footprint of the chip. However, this package requires the semiconductor device bond-pads to be routed to desired land positions by use of an interface, often called an interposer. As disclosed in U.S. Pat. No. 6,477,034, the interposer is a multi-layer, usually a thin 2-layer or 3-layer, flexible or similar substrate that enables the pitch fan-out and routing. U.S. Pat. No. 6,477,034 is incorporated by reference in its entirety herein. Interposers are not preferred. In addition to a major cost addition, extra processing steps are required during package assembly.

Ball grid array ("BGA") packages use printed circuit board substrates for circuit routing and for supporting land repositioning within application limitations, that is to compromise technology limitations in routing features/capabilities against board-attach soldering limits. To enable dense packaging and positioning of the lands, many BGA substrates utilize multi-layer configuration with vias. However, use of such BGA substrates and the addition of vias significantly increase the cost and the processing steps.

A method to manufacture a lead frame for a Quad Flat No-lead ("QFN") package is disclosed in U.S. Pat. No. 6,498,099 to McLellan et al. that is incorporated by reference in its entirety herein. A first side of an electrically conductive substrate is partially etched to define a pad attach and inner lead ends. A semiconductor device is bonded to the partially defined pad attach and electrically interconnected to partially defined inner lead ends by wire bonds or the like. The semiconductor device, partially defined pad attach, partially defined inner leads and wire bonds are then encapsulated in a polymer molding resin. The opposing second side of the electrically conductive substrate is then etched to electrically isolate the pad attach and inner lead ends and to define outer lead ends.

Another method for the manufacture of a QFN package is disclosed in commonly owned U.S. Pat. No. 6,812,552 and is incorporated by reference in its entirety herein. The application that issued as U.S. Pat. No. 6,812,552 was published on Oct. 30, 2003 as United States Patent Application Publication US 2003/0203539 A1.

There remains, however, a need for a method for the manufacture of chip-scale and other semiconductor packages with accurately positioned inner and outer lead ends and routing circuits that do not require complex manufacturing steps or the inclusion of supplemental interposer circuits. Further there remains a need for the packages manufactured by this method.

BRIEF SUMMARY OF THE INVENTION

In accordance with a first embodiment of the invention, there is provided a package for encasing at least one semiconductor device. The package includes a lead frame having opposing first and second ends. The first ends terminate in an array of lands adapted to be bonded to external circuitry and the second ends terminate at an array of chip attach sites. These chip attach sites are directly electrically interconnected to input/output pads on the at least one semiconductor device. Routing circuits electrically interconnect the array of lands and the array of chip attach sites. A first molding compound is disposed between individual lands of the array of lands and a second molding compound encapsulates the at least one semiconductor device, the array of chip attach sites and the routing circuits.

It is a feature of this embodiment that chip-scale packages and packages to encase multiple devices are readily provided. A further feature is that the lead frame is formed from a monolithic electrically conductive structure and supported by the first molding compound. This causes the lead frame to be robust and have few problems with a loss of coplanarity.

In accordance with a second embodiment of the invention, there is provided a process for the manufacture of a package to encase at least one semiconductor device. The process includes: (a) patterning a first side of an electrically conductive substrate to form an array of lands separated by channels, (b) disposing a first molding compound within these channels, (c) patterning a second side of the electrically conductive substrate to form an array of chip attach sites and routing circuits electrically interconnecting the array of lands and the array of chip attach sites, (d) directly electrically interconnecting input/output pads on the at least one semiconductor devices to chip attach site members of the array of chip attach sites, and (e) encapsulating the at least one semiconductor device, the array of chip attach sites and the routing circuits with a second molding compound.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

Like reference numbers and designations in the various drawings indicated like elements.

DETAILED DESCRIPTION

Figure 1:
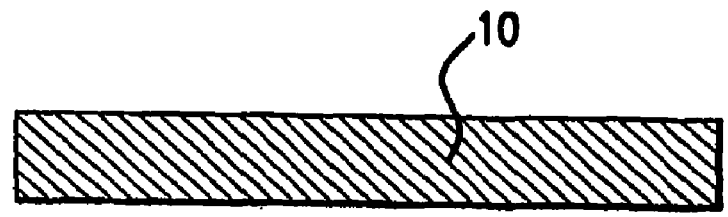
FIG. 1 illustrates in cross-sectional representation an electrically conductive substrate prior to patterning into a lead frame.

FIG. 1 illustrates in cross-sectional representation an electrically conductive substrate 10 that will be patterned into a lead frame used to route electrical signals in a semiconductor package for encasing at least one semiconductor device. The electrically conductive substrate 10 may be formed from any suitable electrically conductive material and is preferably formed from copper or a copper-base alloy. By copper-base alloy it is meant that the electrically conductive substrate 10 contains more than 50%, by weight, of copper. The electrically conductive substrate 10 has a preferred thickness of from 0.10 mm to 0.25 mm (0.004 inch to 0.010) inch and is typically presented in the form of a coil of partially attached substrates that are singulated, typically as the final step in the manufacturing process.

Figure 2A:
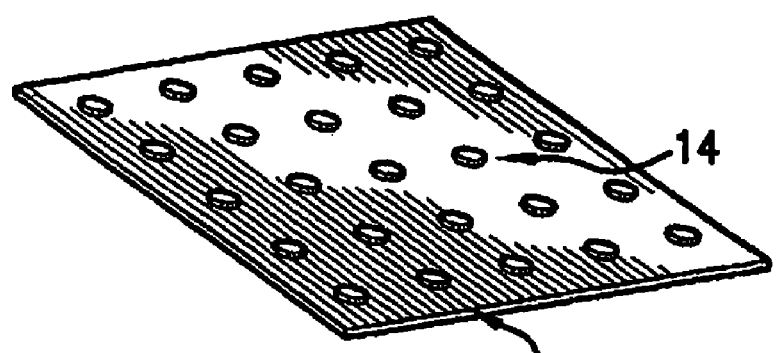
FIG. 2A illustrates in top planar view and FIG. 2B illustrates in cross-sectional representation a lead frame partially patterned on a first side.
Figure 2B:
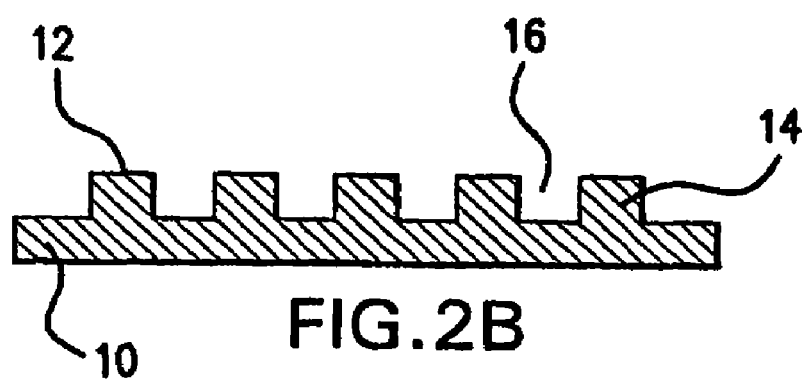

With reference to FIG. 2B, a first side 12 of the electrically conductive substrate 10 is partially patterned to form an array of lands 14 separated by channels 16. The channels may be formed by any controlled subtractive process such as chemical etching or laser ablation. For example, the portions of the first surface intended to form the lands 14 may be coated with a chemical resist and the first surface exposed to a suitable etchant for a time effective to form channels 16. Typically, the channels 16 will have a depth of from 40% to 99% of the thickness of the electrically conductive substrate and preferably, the channel depth will be from 45% to 65% of the thickness of the electrically conductive substrate.

As shown in FIG. 2A, the lands 14 are formed in an array pattern adapted to be bonded to external circuitry, such as matching an array of bond pads on an external printed circuit board.

A first molding compound is then disposed within the channels 16. As shown in FIG. 3B, the first polymer molding resin 18 preferably flush fills the channels 16 such that the first side of the lands 14 become lead-less lands adapted for bonding to external circuitry. The first polymer molding resin may be added to a depth slightly less than the depth of the channels 16 to form the lands with a stand-off distance between the package and external printed circuit board.

Preferably, the first molding resin 18 is electrically non-conductive and preferably a polymer molding resin, such as an epoxy, having a flow temperature in the range of 250° C. to 300° C. Alternatively, the first molding resin may be a low temperature thermal glass composite such as those used to attach a lead frame to a ceramic base in a CERDIP, CERPAK or CERDIP package.

Figure 3A:
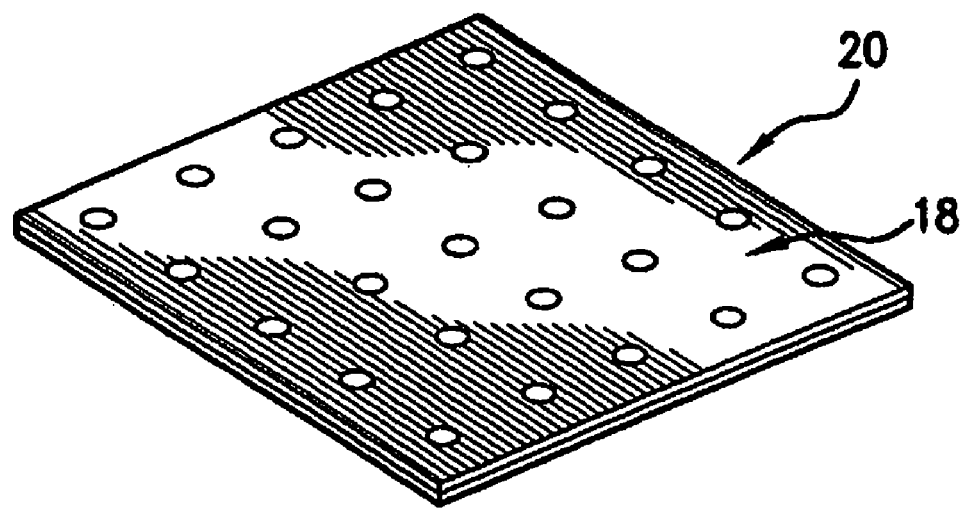
FIG. 3A illustrates in top planar view and FIG. 3B illustrates in cross-sectional representation the partially patterned lead frame with features embedded in a polymer molding resin.
Figure 3B:
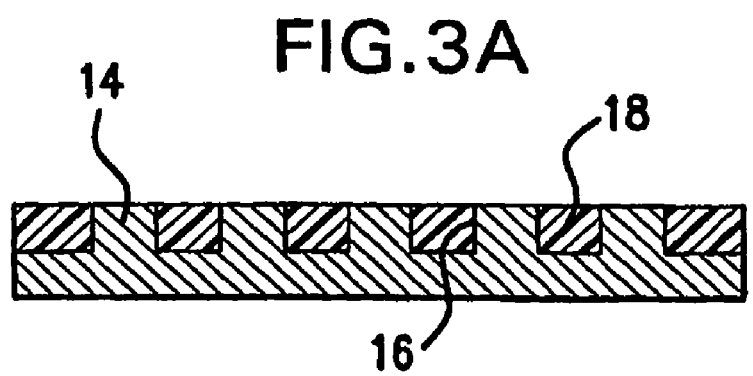

This assembly, a lead frame precursor 20 as illustrated in FIG. 3A, may be supplied by a lead frame supplier to a package assembly house for further processing, or the processing may continue with the lead frame manufacturer.

Figure 4:
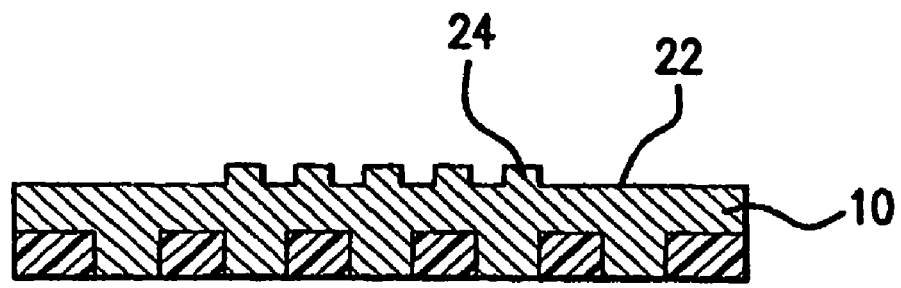
FIG. 4 illustrates in cross-sectional representation the formation of lead pillars in the second side of the partially patterned lead frame.

As shown in FIG. 4, an opposing second side 22 of the electrically conductive substrate 10 is then patterned to form chip attach sites 24 that are formed in an array effective for direct electrical interconnection to input/output pads on a semiconductor device. Any suitable method may be used to pattern the chip attach sites 24, such as a chemical etch or laser ablation. Preferably, a chemically resistant material is applied in the pattern of the array and the second side is then exposed to an etch solution for a time effective to remove sufficient material to define the chip attach sites 24.

Figure 5A:
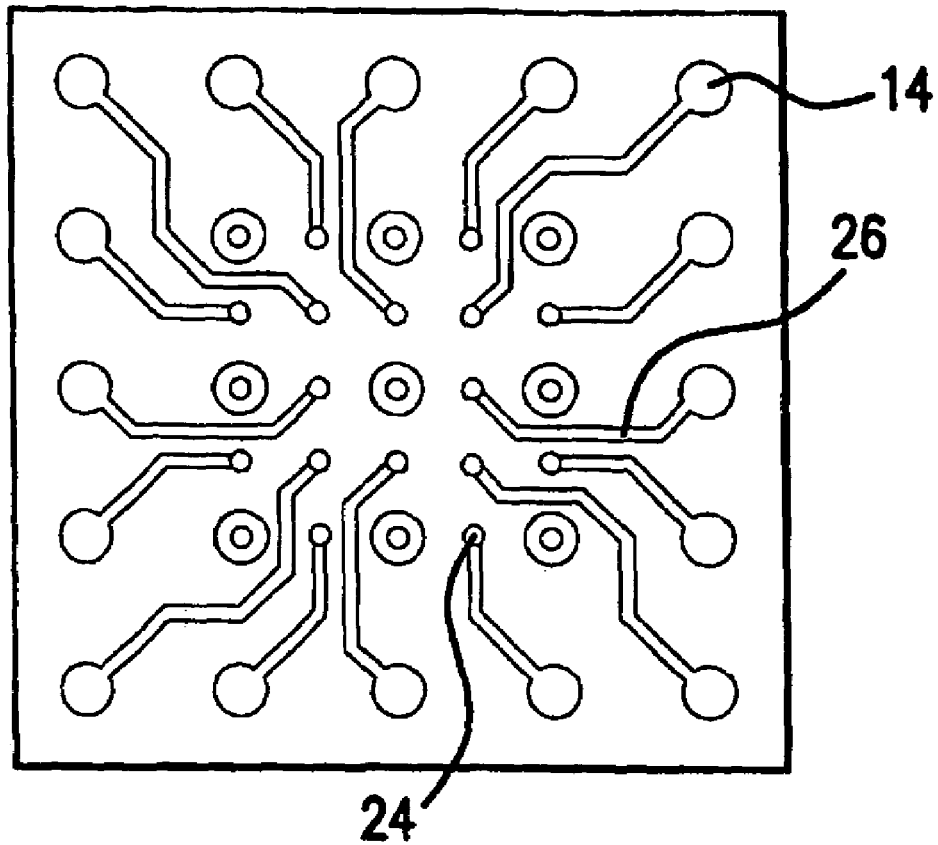
FIG. 5A illustrates in top planar view and FIG. 5B illustrates in cross-sectional representation the formation of routed lead frame features in the second side of the partially patterned lead frame.
Figure 5B:
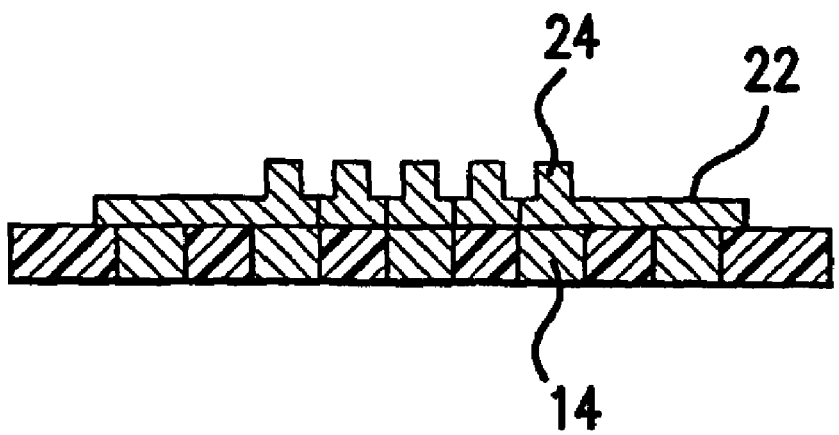

As illustrated in FIGS. 5A and 5B, the second side 22 is further patterned to form routing circuits 26 that electrically interconnect the chip attach sites 24 and the lands 14. Metal between routing circuits is removed to electrically isolate individual combinations of chip attach site—routing circuit—land.

Figure 6A:
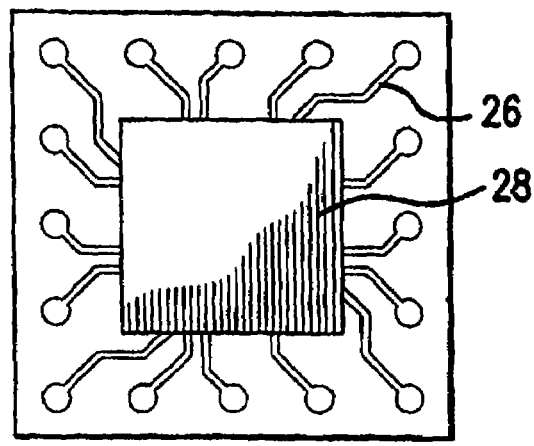
FIG. 6A illustrates in top planar view and FIG. 6B illustrates in cross-sectional representation the attachment of a semiconductor device to the lead pillars.
Figure 6B:
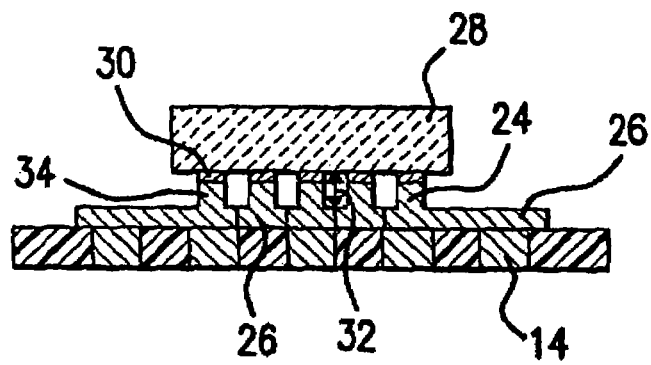

A semiconductor device 28 is directly electrically interconnected to the chip attach sites 24 as shown in FIGS. 6A and 6B. By "directly" it is meant that the interconnection is by a flip chip method without the use of an intervening wire bond or tape automated bonding (TAB) tape. Suitable attachments 30 include solders with a primary constituent selected from the group consisting of gold, tin and lead with a melting temperature in the range of between 180° C. and 240° C. The spacing 32 between the semiconductor device 28 and routing circuits 26 is to facilitate the flow of a second molding compound, as detailed below. Preferably, 50% to 75% (in height) of the spacing 32 is due to the chip attach pillar 34 and 50%-25% (in height) of the spacing is due to attachment 30.

Figure 7:
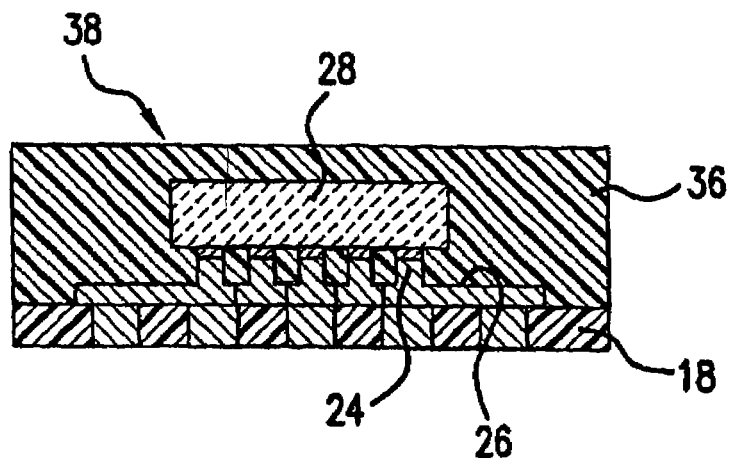
FIG. 7 illustrates in cross-sectional representation a lead frame routed semiconductor package in accordance with a first embodiment of the invention.

With reference to FIG. 7, the second molding compound 36 then encapsulates the semiconductor device 28, chip attach sites 24 and routing circuits 26 to complete the package 38 for encasing at least one semiconductor device. As with the first molding compound 18, the second molding compound 36 is electrically non-conductive and preferably a polymer molding resin, such as an epoxy, having a flow temperature in the range of 250° C. to 300° C. Alternatively, the second molding compound may also be a low temperature thermal glass composite such as those used to attach a lead frame to a ceramic base in a CERDIP, CERPAK or CERDIP package.

The combination of chip attach sites 24, chip attach pillars 34, routing circuits 26 and lands 14 is referred to as a "Re-Distributed Lead Frame" or RDLF. The RDLF is formed from a single electrically conductive substrate as a monolithic structure. In the package embodiment shown in FIG. 7, the array of lands 14 occupies a larger real estate than the array of chip attach sites 24. This type of package is a QFN (Quad-Flat-No lead) Flip-Chip package. Among the advantages of the package 38 of the invention over prior QFN Flip-Chip packages are:

a. the routing circuits are supported flat on the first molding compound, unlike the flatness problems associated with glued down or built-up circuit traces;
 b. being supported, lead finger co-planarity issues disappear;
 c. the flip-chip interconnection is highly robust and applicable for all packaging sizes and formats;
 d. there are no exposed circuit traces or routing circuits under the package as in an etched leadless flip-chip package;
 e. accommodates any chip-pad location and pitch;
 f. approaches 100% yield and quality conformance;
 g. eliminates need for interposer and adapts to existing chip designs;
 h. the packaging area can be populated with mixed interconnections (wire bond, aluminum ultrasonic bond, flip-chip attach, etc.);
 i. suitable for encapsulating multiple chips and surface mount passives;
 j. no circuit traces or routing circuits are exposed at the bottom of the package, only leadless lands are present with or without desired stand-off;
 k. the package may be very thin since a separate interposer is not required; and
 l. the package may offer a thermal pad exposed on the bottom of package like a die-pad that can be connected to ground or thermal bumps on the chip.

Figure 8:
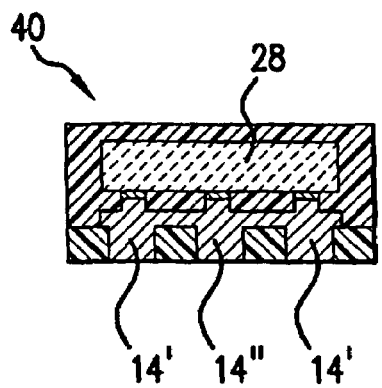
FIG. 8. illustrates in cross-sectional representation a chip scale package in accordance with the invention.

FIG. 8 illustrates the RDLP (Re-Distributed Leadframe Package) of the invention in a chip scale package 40. In this embodiment, outermost rows of lands 14' are positioned under the foot print of the semiconductor device 28 and subsequent rows of lands 14" are positioned within the perimeter defined by the outermost rows of lands 14'. The CSP 40 occupies substantially the same amount of real estate as the semiconductor device 28.

Figure 9:
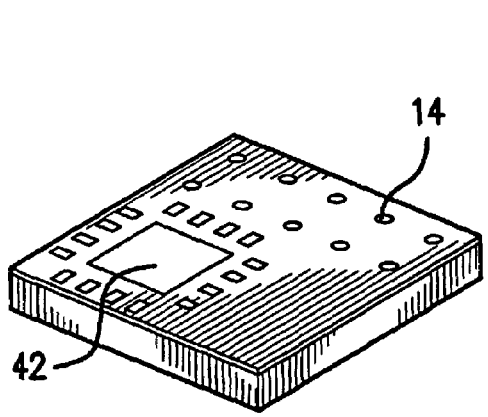
FIG. 9 illustrates in bottom planar view a land array for a multi-device package in accordance with the invention.
Figure 10:
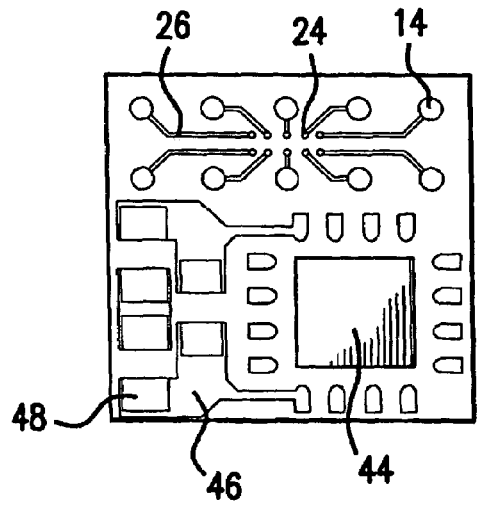
FIG. 10 illustrates in top planar view a chip attach site array for the multi-device package of FIG. 9.
Figure 11:
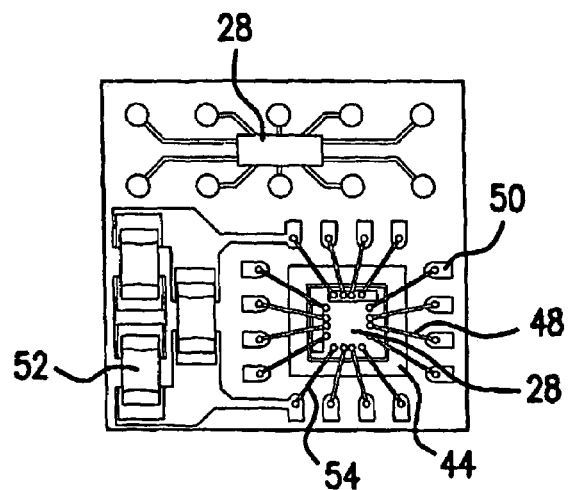
FIG. 11 illustrates in top planar view the chip attach site array of FIG. 9 with multiple devices attached.

FIGS. 9 through 11 illustrate embodiments of the invention within a multi-device package. Although any of the RDLP configurations illustrated may be equally used in a single device package.

FIG. 9 illustrates in bottom planar view a land array for a multi-device package in accordance with the invention. In addition to lands 14 for electrical interconnection to external circuitry, the first side of the electrically conductive substrate may be patterned into a heat sink 42 for thermal interconnection to an external thermal dissipater.

FIG. 10 illustrates in top planar view an array of chip attach sites 24 interconnected to the lands 14 of FIG. 9 by routing circuits 26. Other features patterned in the second side include a die pad 44 thermally interconnected to the heat sink 42 and bond sites 46 for passive devices such as resistors or capacitors. Portions of the bond sites 46 may be coated with a solderable metal, such as gold, to facilitate attachment of the passive devices.

FIG. 11 illustrates some of the flexibility achieved with the RDLP of the invention. A first semiconductor device 28 is flip chip bonded to the chip attach sites. A second semiconductor device 28' is attached to the die pad 44 and wire bonded 48 to wire bond pads 50. Passive devices 52 are soldered to bond sites 46 and electrically interconnected 54 to the second semiconductor die 28'. The features and devices illustrated in FIG. 11 are then encapsulated in the second molding resin (not shown) to complete the multi-device package.

One or more embodiments of the present invention have been described. Nevertheless, it will be understood that various modifications may be made without departing from the spirit and scope of the invention. Accordingly, other embodiments are within the scope of the following claims.

What is claimed is:

1. A package (38) for encasing at least one semiconductor device (28), comprising:
 a lead frame including an electrically conductive substrate and having opposing first and second sides,
  said first side of said lead frame having a planar first side surface and an array of lands (14), each of said lands protruding from said first side surface, said lands adapted to be bonded to external circuitry and being arranged in a first pattern, and
  said second side of said lead frame having a planar second side surface and an array of chip attach sites (24), each of said chip attach sites protruding from said second side surface, said chip attach sites being arranged in a second pattern and being directly electrically interconnected by interconnections (30) to input/output pads on said at least one semiconductor device (28), said chip attach sites disposed opposite said input/output pads, and
 a plurality of electrically isolated routing circuits (26) electrically interconnecting individual combinations of said array of lands (14) and said array of chip attach sites (24);
 a first molding compound (18) disposed on said first side surface and between individual lands of said array of lands (14); and
 a second molding compound (36) encapsulating said at least one semiconductor device (28), said array of chip attach sites (24) and said routing circuits (26),
 wherein
 the lands and chip attach sites are formed from a monolithic electrically conductive structure, and
 the array of lands has a larger lateral extent than the array of chip attach sites.

2. The package (38) of claim 1 wherein said lead frame and said routing circuits (26) are elements of a single electrically conductive substrate (10).

3. The package (38) of claim 2 wherein said single electrically conductive substrate (10) is copper or a copper-base alloy.

4. The package (38) of claim 2 wherein a first perimeter defined by said array of lands (14) does not exceed a second perimeter defined by said at least one semiconductor device (28).

5. The package (38) of claim 4 being a chip scale package.

6. The package (38) of claim 2 wherein a distance (32) between said at least one semiconductor device (28) and said routing circuits (26) is at least 75 microns and a space defined by said distance (32) is filled with said second molding compound (36).

7. The package (38) of claim 6 wherein said distance (32) is from 100 microns to 150 microns.

8. The package (38) of claim 2 further including a heat sink (42) that is a single electrically conductive substrate with said lead frame and coplanar with said array of lands (14).

9. The package (38) of claim 2 further including a die pad (44) for bonding one of said at least one semiconductor devices (28), said die pad (44) being monolithic with said lead frame.

10. The package (38) of claim 2 further including bond sites for bonding a passive device (52), said bond sites being monolithic with said lead frame.

11. The package (38) of claim 2 wherein said array of lands (14) and said first molding compound (18) are coplanar.

12. The package (38) of claim 2 wherein said array of lands (14) extend beyond said first molding compound (18).

13. The package (38) of claim 1 wherein the chip attach sites (24) are not coplanar with the routing circuits (26).

14. The package (38) of claim 2 wherein a distance (32) between said at least one semiconductor device (28) and said routing circuits (26) is at least 25 microns and a space defined by said distance (32) is filled with said second molding compound (36).

* * * * *